US012679772B2

(12) United States Patent
Hwang et al.

(10) Patent No.: US 12,679,772 B2
(45) Date of Patent: Jul. 14, 2026

(54) CERAMIC COMPONENT AND METHOD OF MANUFACTURING CERAMIC COMPONENT

(71) Applicant: Solmics Co., Ltd., Pyeongtaek-si (KR)

(72) Inventors: Sungsic Hwang, Seoul (KR); Junrok Oh, Seoul (KR); Kyoungyeol Min, Yongin-si (KR); Kyungin Kim, Hwaseong-si (KR); Jungkun Kang, Pyeongtaek-si (KR); Younguk Han, Pyeongtaek-si (KR)

(73) Assignee: Solmics Co., Ltd., Pyeongtaek-si (KR)

( * ) Notice: Subject to any disclaimer, the term of this patent is extended or adjusted under 35 U.S.C. 154(b) by 893 days.

(21) Appl. No.: 17/884,892

(22) Filed: Aug. 10, 2022

(65) Prior Publication Data

US 2022/0380262 A1 Dec. 1, 2022

Related U.S. Application Data

(63) Continuation of application No. PCT/KR2021/001726, filed on Feb. 9, 2021.

(30) Foreign Application Priority Data

| | | |
|---|---|---|
| Feb. 12, 2020 | (KR) | 10-2020-0017197 |
| Jul. 29, 2020 | (KR) | 10-2020-0094459 |
| Jul. 29, 2020 | (KR) | 10-2020-0094460 |

(51) Int. Cl.
C04B 35/563 (2006.01)
B28B 11/24 (2006.01)
(Continued)

(52) U.S. Cl.
CPC .......... C04B 35/563 (2013.01); B28B 11/243 (2013.01); C04B 35/645 (2013.01);
(Continued)

(58) Field of Classification Search
CPC . H01J 37/32642; C04B 35/563; C04B 35/645
See application file for complete search history.

(56) References Cited

U.S. PATENT DOCUMENTS

| | | |
|---|---|---|
| 5,505,899 A | 4/1996 | Sigl et al. |
| 5,543,371 A | 8/1996 | Katayama et al. |

(Continued)

FOREIGN PATENT DOCUMENTS

| | | |
|---|---|---|
| CN | 104701126 A | 6/2015 |
| CN | 108409328 A | 8/2018 |

(Continued)

OTHER PUBLICATIONS

International Search Report issued on May 27, 2021 in counterpart Patent Application No. PCT/KR2021/001726 (3 pages in English, 3 pages in Korean).

(Continued)

*Primary Examiner* — Aiden Lee
(74) *Attorney, Agent, or Firm* — NSIP Law

(57) ABSTRACT

The present disclosure relates to a ceramic component including a boron carbide, wherein a difference of a first residual stress measured at a first spot on a surface of the ceramic component and a second residual stress measured at a second spot on the surface having different distance from a center of the surface than the first spot is −600 to +600 MPa.

11 Claims, 2 Drawing Sheets

(51) Int. Cl.
    *C04B 35/645*     (2006.01)
    *H01J 37/32*     (2006.01)
    *H10P 72/76*     (2026.01)

(52) U.S. Cl.
    CPC .... *H01J 37/32642* (2013.01); *H10P 72/7616* (2026.01); *C04B 2235/3821* (2013.01); *C04B 2235/6027* (2013.01); *C04B 2235/612* (2013.01); *C04B 2235/6567* (2013.01); *C04B 2235/9669* (2013.01); *H01J 2237/334* (2013.01)

(56) References Cited

U.S. PATENT DOCUMENTS

| | | | | |
|---|---|---|---|---|
| 12,428,347 | B2 * | 9/2025 | Hwang | C04B 35/563 |
| 2002/0100554 | A1 * | 8/2002 | Han | H01J 37/32467 |
| | | | | 156/345.1 |
| 2008/0268172 | A1 * | 10/2008 | Fukuda | C23C 16/509 |
| | | | | 427/569 |
| 2009/0169726 | A1 * | 7/2009 | Fujii | H10P 72/722 |
| | | | | 156/345.52 |
| 2010/0297350 | A1 | 11/2010 | Forrest et al. | |
| 2015/0162170 | A1 | 6/2015 | Kishi et al. | |
| 2015/0284296 | A1 | 10/2015 | Osanai et al. | |
| 2018/0201545 | A1 | 7/2018 | Nagatomo | |
| 2018/0209031 | A1 * | 7/2018 | Gothelid | C23C 28/42 |
| 2020/0087216 | A1 * | 3/2020 | Cui | B23K 26/53 |
| 2021/0108077 | A1 * | 4/2021 | Berleue | C08F 290/067 |
| 2024/0051033 | A1 * | 2/2024 | Elkouby | C23C 30/005 |

FOREIGN PATENT DOCUMENTS

| | | | |
|---|---|---|---|
| CN | 110582834 | A | 12/2019 |
| EP | 3 611 753 | A1 | 2/2020 |
| JP | 63-236763 | A | 10/1988 |
| JP | 7-97264 | A | 4/1995 |
| JP | 11-21163 | A | 1/1999 |
| JP | 2001-261457 | A | 9/2001 |
| JP | 2003-231005 | A | 8/2003 |
| JP | 2004-161512 | A | 6/2004 |
| JP | 3770288 | B2 | 4/2006 |
| JP | 2007-513257 | A | 5/2007 |
| JP | 2008-537703 | A | 9/2008 |
| JP | 4570195 | B2 | 10/2010 |
| JP | 2015-115421 | A | 6/2015 |
| JP | 2015-124137 | A | 7/2015 |
| JP | 6058822 | B2 | 12/2016 |
| KR | 10-1998-0063542 | A | 10/1998 |
| KR | 10-2006-0106865 | A | 10/2006 |
| KR | 10-2011-0018997 | A | 2/2011 |
| KR | 10-1123391 | B1 | 3/2012 |
| KR | 10-2015-0068312 | A | 6/2015 |
| KR | 10-1628689 | B1 | 6/2016 |
| KR | 10-2018-0093814 | A | 8/2018 |
| KR | 10-2018-0117275 | A | 10/2018 |
| KR | 10-2020-0020764 | A | 2/2020 |
| WO | WO 2000/07216 | A | 2/2000 |
| WO | WO 2018/105297 | A1 | 6/2018 |
| WO | WO 2019/156296 | A1 | 8/2019 |

OTHER PUBLICATIONS

International Written Opinion issued on May 27, 2021 in counterpart Patent Application No. PCT/KR2021/001726 (3 pages in Korean).

* cited by examiner

CERAMIC COMPONENT AND METHOD OF MANUFACTURING CERAMIC COMPONENT

CROSS-REFERENCE TO RELATED APPLICATIONS

Pursuant to 35 USC 120 and 365(c), this application is a continuation of International Application No. PCT/KR2021/001726 filed on Feb. 9, 2021, and claims the benefit under 35 USC 119(a) of Korean Application Nos. 10-2020-0017197 filed on Feb. 12, 2020, 10-2020-0094459 filed on Jul. 29, 2020, and 10-2020-0094460 on Jul. 29, 2020, in the Korean Intellectual Property Office, the entire disclosures of which are incorporated herein by reference for all purposes.

BACKGROUND

1. Field

The present disclosure relates to a ceramic component and methods of manufacturing a ceramic component and a semiconductor element.

2. Description of the Background

A plasma processing apparatus applies an electric power between upper and lower electrodes disposed inside a chamber and a semiconductor wafer and a substrate such as a glass substrate placed on the lower electrode. The electrons accelerated by an electric field between the electrodes, the electrons emitted from the electrodes, or the heated electrons cause ionization collision with molecules of a processing gas, and as a result, plasma is produced from the processing gas. Reactive species such as radicals or ions in plasma perform a desired micromachining process, for example, an etching process, on the substrate surface. Recently, a designing rule of micro-scale electronic components is being increasingly detailed, particularly, in a plasma etching, higher measurement accuracy is demanded, and therefore, a remarkably higher electric power than a conventional electric power is being used. Such a plasma processing apparatus includes a focus ring affected by plasma. The focus ring is also referred to as an edge ring, a cold ring, or the like.

In a case of the focus ring, as an electric power is increased, due to a wavelength effect, by which a standing wave is formed, and a skin effect, by which an electric field is concentrated in the center on the surface of the electrode, and the like, in terms of the plasma, mostly the center portion is maximized and the edge portion becomes the lowest on the substrate, and therefore nonuniformity of the distribution of the plasma on the substrate is intensified. When the distribution of plasma on the surface is not uniform, plasma processing cannot be performed consistently, and the quality of the micro-scale electronic components are degraded. A focus ring with high functionality requires extended replacement period. In this case, a term for each cycle in opening a plasma chamber may also be extended. When the term for each cycle in opening the chamber is extended, improved yield for manufacturing the micro-scale electronic components using a wafer may be achieved.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, the ceramic component according to the embodiment may include a boron carbide, wherein a difference of a first residual stress measured at a first spot on a surface of the ceramic component and a second residual stress measured at a second spot on the surface having different distance from a center of the surface than the first spot may be −600 to +600 MPa.

In one embodiment, a difference between a maximum value and a minimum value among the first residual stress, the second residual stress, and a third residual stress measured at a third spot on the surface having different distance from the center of the surface than the first spot and the second spot, may be −600 to +600 MPa.

In one embodiment, the ceramic component may be a part of a device for manufacturing a semiconductor element.

In one embodiment, the ceramic component may be a part of a plasma etching equipment, wherein the ceramic component may include a main body having a first height from a reference plane and a mounting body having a second height from the reference plane, and wherein a difference between a main body residual stress measured on an upper surface of the main body and a mounting body residual stress measured on an upper surface of the mounting body may be −600 to +600 MPa.

In another general aspect, a focus ring according to the embodiment may include a boron carbide and may include a main body having a first height from a reference plane and a mounting body having a second height from the reference plane, wherein an upper surface of the main body is etched by plasma and an etching target is mounted on an upper surface of the mounting body, wherein a difference between a main body residual stress measured on the upper surface of the main body and a mounting body residual stress measured on the upper surface of the mounting body is within 40% of an average of the main body residual stress and the mounting body residual stress.

In one embodiment, a difference of a first residual stress measured at a first spot on a surface of the focus ring and a second residual stress measured at a second spot on the surface having different distance from a center of the surface than the first spot may be −600 to +600 MPa.

In one embodiment, a standard deviation of residual stresses measured at three spots on the surface of the focus ring having different distances from the center of the surface may be 350 MPa or less.

In one embodiment, the focus ring may further include a connecting body between the main body and the mounting body, wherein the connecting body may include an upper surface connecting the upper surface of the mounting body and the upper surface of the main body.

In one embodiment, a difference between a maximum value and a minimum value among the main body residual stress, the mounting body residual stress, and a connecting body residual stress measured at a spot on the upper surface of the connecting body may be within 25% of an average of the main body residual stress, the mounting body residual stress, and the connecting body residual stress.

In one embodiment, the focus ring may have a bending strength of 300 MPa or more.

In one embodiment, the focus ring may be a part of a device for manufacturing a semiconductor element.

In one general aspect, a method of manufacturing a ceramic component according to the embodiment may include: preparing a granulated raw material by making a slurry of a raw material composition including a boron carbide powder and granulating the slurry; manufacturing a sintering body through necking the boron carbide powder by filling a shaping die with the granulated raw material and sintering of the granulated raw material at a temperature of 1800° C. or more and a pressure of 15 MPa or more; and processing the sintering body with a thermal treatment and shaping machining to prepare the ceramic component.

In one embodiment, the thermal treatment may include a primary treatment performed at a first temperature for 1 hour or more and a secondary treatment performed at a second temperature for 1 hour or more.

In one embodiment, the first temperature may be higher than the second temperature.

In one embodiment, the first temperature may be 1650° C. or higher.

In one embodiment, the second temperature may be 1400° C. or higher.

In one embodiment, a difference of a first residual stress measured at a first spot on a surface of the ceramic component and a second residual stress measured at a second spot on the surface having different distance from a center of the surface than the first spot may be −600 to +600 MPa.

In one embodiment, the ceramic component may include a main body having a first height from a reference plane and a mounting body having a second height from the reference plane, wherein an upper surface of the main body is etched by plasma and an etching target is mounted on an upper surface of the mounting body, wherein a difference between a main body residual stress measured on the upper surface of the main body and a mounting body residual stress measured on the upper surface of the mounting body may be within 40% of an average of the main body residual stress and the mounting body residual stress.

In one embodiment, a standard deviation of residual stresses measured at three spots on the surface of the ceramic component having different distances from a center of a surface of the ceramic component may be 350 MPa or less.

In one embodiment, the ceramic component may further include a connecting body between the main body and the mounting body, wherein the connecting body includes an upper surface connecting the upper surface of the mounting body and the upper surface of the main body, and wherein a difference between a maximum value and a minimum value among the main body residual stress, the mounting body residual stress, and a connecting body residual stress measured at a spot on the upper surface of the connecting body may be within 25% of an average of the main body residual stress, the mounting body residual stress, and the connecting body residual stress.

Other features and aspects will be apparent from the following detailed description and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
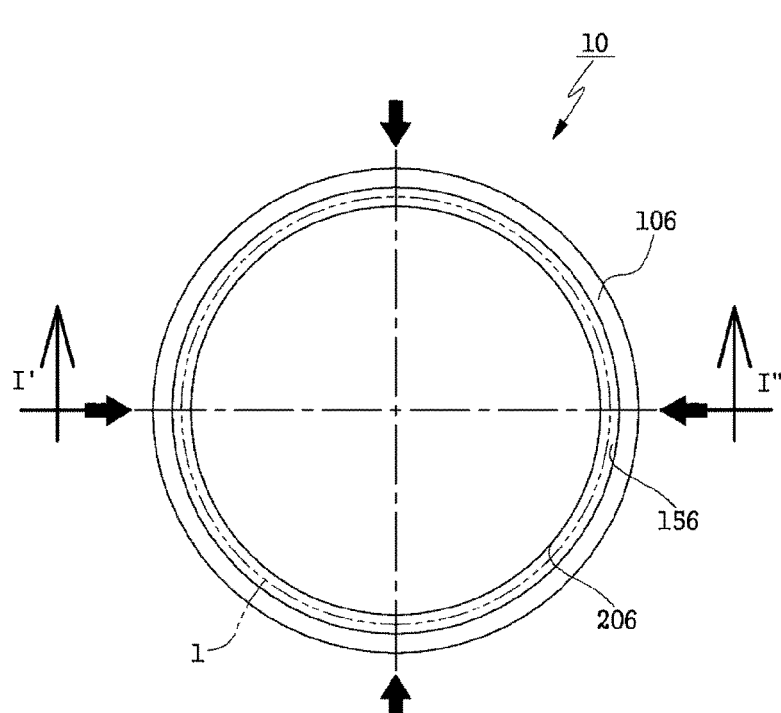
FIG. 1 is a schematic drawing for illustrating the view from an upper position of the focus ring, which is an example of the ceramic component according to embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

In this disclosure, when a component "comprises" or "includes" another component, this means other components may be further comprised or included, and does not mean the other composition is excepted, unless specially stated otherwise.

In this disclosure, when a component is "connected" with another component, this includes a case of 'being connected with having another component therebetween', as well as a case of 'being directly connected'.

In this disclosure, "B being placed on A" means that B is placed in direct contact with A or placed over A with another layer or structure interposed therebetween and thus should not be interpreted as being limited to B being placed in direct contact with A.

In this disclosure, the phrase "combination(s) thereof" included in a Markush-type expression denotes one or more mixtures or combinations selected from the group consisting of components stated in the Markush-type expression, that is, denotes one or more components selected from the group consisting of the components are included.

In this disclosure, the statement of "A and/or B" means "A, B, or A and B."

In this disclosure, terms such as "first", "second", "A", or "B" are used to distinguish the same terms from each other unless specially stated otherwise.

In this disclosure, a singular form is contextually interpreted as including a plural form as well as a singular form unless specially stated otherwise.

In this disclosure, the term of "difference" means the value obtained by subtracting a value from another value, and if there is not a special statement, it is indicated by the value of subtracting a smaller value from a larger value.

In this disclosure, boron carbide refers to all compounds having boron and carbon as base elements. The boron carbide may be one having a boron carbide material, in which an additive and/or a doping material are included or not included, and in detail, may be one, in which the sum of boron and carbon is 90 mol % or more. The boron carbide may have the sum of boron and carbon of 95 mol % or more. The boron carbide may have the sum of boron and carbon of 98 mol % or more. The boron carbide may have the sum of boron and carbon of 99 mol % or more. In this disclosure, the boron carbide may be a single phase or a multi-phase or may be a mixture thereof. The boron carbide single phase includes both stoichiometric phase and non-stoichiometric phase, which is out of the stoichiometric composition of boron and carbon, wherein the multi-phase refers to one, in which at least two among compounds having boron and carbon as base elements have been mixed in a predetermined ratio. Also, the boron carbide in this disclosure includes both cases of forming a solid solution by adding impurities to a single phase or a multi-phase of the boron carbide, and case of having inevitably added impurities, which are mixed during a process for manufacturing the boron carbide. As an example of the impurities, metals such as iron, copper, chrome, nickel and aluminum may be present.

In this disclosure, a bulk boron carbide refers to a deposition boron carbide, a sintering boron carbide and the like, distinguished from a coating layer, and it is defined as one having an average thickness of 1 mm or more in order for being separated from the coating layer.

In this disclosure, a phrase of 'the difference between A value and B value is C or less' means that the absolute value of the difference between A value and B value is C or less, and more particularly, it means that the difference between A value and B value is —C to +C.

In this disclosure, residual stress is described based on the result of measuring with X-ray diffraction.

Hereinafter, the present disclosure will be described in further detail.

One objective of the present disclosure is to provide a method for efficiently manufacturing semiconductor elements while improving quality of ceramic components at the same time.

Another objective of the present disclosure is to provide a ceramic component, whose characteristics such as strength and relative density are excellent, with excellent shape processability.

According to the method of manufacturing the ceramic component of the present disclosure, a ceramic component used in an apparatus for manufacturing semiconductor elements, can be manufactured efficiently, while improving the quality of the ceramic component.

The ceramic component of the present disclosure can maintain or enhance various characteristics such as strength and relative density, in addition to having comparatively even distribution of residual stress and excellent shaping machining processability.

According to the focus ring and the method of manufacturing the focus ring, a focus ring having excellent properties such as etching resistance and impact resistance as well as outstanding shaping machining processability, can be manufactured with high success rate.

Manufacturing Method of Ceramic Component

In a general aspect, a manufacturing method of ceramic components according to one embodiment includes the first operation of preparing a granulated raw material by making a slurry of a raw material composition including boron carbide powder and granulating the slurry; the second operation of manufacturing a pressurized sintering body, in which the boron carbide powder is treated with necking by filling a shaping die with the granulated raw material and sintering the granulated raw material at a temperature of 1800° C. or more and a pressure of 15 MPa or more; and the third operation of processing the sintering body with thermal treatment and shaping machining to manufacture the ceramic component.

The thermal treatment may include a primary treatment proceeding for 1 hour or more at a first temperature and a secondary treatment proceeding for 1 hour or more at a second temperature.

The first temperature may be a higher than the second temperature,

The residual stress values measured at the surface of two spots with different distances from the center of the ceramic component may be S1 and S2, respectively, and the difference between S1 and S2 may be −600 to +600 MPa.

The raw composition includes a boron carbide powder. The boron carbide powder may be of a high degree of purity (the amount of boron carbide is 99 wt % or more). Alternatively, the boron carbide powder may be of a low degree of purity (the amount of boron carbide is 95 wt % or more and less than 99 wt %).

The boron carbide powder may be one having a diameter of 150 μm or less, based on D50.

The boron carbide powder may have an average diameter of about 1.5 μm or less based on D50. The boron carbide powder may have an average diameter of about 0.3 μm to about 1.5 μm based on D50. The boron carbide powder may have an average diameter of about 0.4 μm to about 1.0 μm, based on D50. Also, the boron carbide powder may have an average diameter of about 0.4 μm to about 0.8 μm, based on D50. When a boron carbide powder, whose average diameter is small is applied, the densification of a sintering body can be more easily obtained.

The boron carbide powder may have a diameter of about 2 to 10 μm or less based on D50. The boron carbide powder may have a diameter of about 3 to 8 μm or less based on D50. The boron carbide powder may have a diameter of about 4 to 6 μm or less based on D50. When a boron carbide powder having such a diameter range is applied, the productivity of processes as well as the densification of a sintering body can be improved.

The raw material composition may further include an additive. The additive may be added in a process for manufacturing the ceramic components in a state of a powder form, liquid form, or a gas form. A material used as the additive may be, for example, carbon, boron oxide, silicon, silicon carbide, silicon oxide, boron nitride, boron, or silicon nitride. The additive may be included in an amount of about 0.1 wt % to about 30 wt % based on the total weight of the raw material.

The additive may be a sinterability enhancer. The sinterability enhancer is included in the raw material to improve the properties of the sintering body. The sinterability enhancer may be selected from the group consisting of carbon, boron oxide, silicon, silicon carbide, silicon oxide, boron nitride, boron nitride, silicon nitride, and combinations thereof. The sinterability enhancer may be included in an amount of about 30 wt % or less based on the total weight of the raw material. In detail, the sinterability enhancer may be included in an amount of about 0.001 wt % to about 30 wt %, based on the total weight of the raw material. The sinterability enhancer may be included in an amount of about 0.1 to 15 wt %, based on the total weight of the raw material. The sinterability enhancer may be included in an amount of about 1 to 10 wt %, based on the total weight of the raw material. When the sinterability enhancer is included in an amount of more than 30 wt %, the strength of a sintering body may be reduced instead.

The raw material may include a boron carbide raw material such as a boron carbide powder as a residual amount except for the sinterability enhancer. The sinterability enhancer may include boron oxide, carbon, and combinations thereof.

When carbon is applied as the sinterability enhancer, the carbon may be added as a resin form such as a phenol resin or a novolac resin, and the resin may be applied as a carbon in a carbonated state through a carbonation process. The carbonation process of the resin may be an ordinary process of carbonating a polymer resin. The phenol resin may be one, in which the amount of residual carbon is 40 wt % or more.

When carbon is applied as the sinterability enhancer, the carbon may be included in an amount of 1 to 10 wt % based on the total weight of the raw material. The carbon may be included in an amount of 1 to 8 wt %. The carbon may be included in an amount of 2 to 6 wt %. The carbon may be included in an amount of 3 to 5 wt %. When carbon is included as the sinterability enhancer in such an amount, a boron carbide, in which a necking phenomenon among grains may be easily induced, the size of a grain may be relatively large, and the relative density may be relatively high. However, when the carbon is included in an amount of more than 10 wt %, the occurrence of a gas such as carbon dioxide becomes excessive in a process of pressurizing and sintering, and workability thereof may be lowered.

The sinterability enhancer may be boron oxide. The boron oxide may be one represented by $B_2O_3$, and when the boron oxide is applied, boron carbide is generated through chemical reaction with carbon present inside pores of a sintering body and the like, emitting of residual carbons may be increased, and thereby a sintering body with further densification can be provided.

When the boron oxide and the carbon are applied together as the sinterability enhancer, the relative density of the sintering body can be higher, and a sintering body with a decreased carbon area present inside pores and improved densification can be manufactured.

The born oxide and the carbon may be applied in a weight ratio of 1:08 to 4. In such a case, a sintering body improved in the relative density can be obtained.

The sinterability enhancer may have a melting point of about 100° C. to about 1000° C. In further detail, the meting point of the additive may be about 150° C. to about 800° C. The melting point of the additive may be about 200° C. to about 400° C. According to the above, the additive may be easily diffused among the boron carbide grains in a sintering process of the raw material.

The raw material composition may further include a dispersant, a solvent, and the like as needed.

The raw material composition does not include or includes in a very low amount of a material, which may generate a by-product in a solid state during a semiconductor process. For example, as materials that may generate the by-product, there are metals such as iron, copper, chrome, nickel and aluminum. The amount of the material, which may generate the by-product, may be 500 ppm or less based on the raw material.

Making a slurry is achieved by a process of mixing a raw material composition sufficiently and substantially uniformly through a method such as ball-milling. At this time, a solvent may be applied together, and an alcohol such as methanol, methanol, ethanol or butanol, or water may be applied as the solvent. The solvent may be applied in an amount of about 60 volume % to about 80 volume % based on a total volume of the slurry. The ball-milling may be performed by specifically applying a polymer ball, and the slurry mixing process may proceed for about five hours to about twenty hours.

Granulation may be performed by a method, in which, while the slurry is injected, the solvent included in the slurry is removed by evaporation and the like and the raw material is granulated. Granulated raw material grains manufactured in this manner can have characteristics of an overall round-shaped grain and comparatively regular grain size.

The raw material grain after the granulation process may have a size of 50 to 160 μm. The raw material may have a size of 60 to 100 μm. When such a raw material grain is applied, filling a mold may be easier and the workability can be improved more in a subsequent process such as sintering.

The second operation is the operation of manufacturing a sintering body, in which the boron carbide powder grains are necked from one another by filling a shaping die with the raw material grains for sintering of the grains.

There have been many attempts to manufacture a boron carbide sintering body in a bulk shape through a method of pressurizing and sintering. However, ordinarily, it was manufactured and evaluated as a small particle with a size of about 30 mm vertically and horizontally, which is generally called as a coupon. A boron carbide sintering body with a relatively large diameter in a bulk shape (used together with boron carbide below) is not easy to be manufactured.

The inventors confirmed through experiments that, when a pressurized sintering body with a relatively large size is manufactured, particularly, by a pressurizing and sintering method, the pressurized sintering body, even if stable manufacture thereof may be achieved up to a bulk shape, had a characteristic of a crack, a break and the like occur frequently during the process of shaping machining into a ring shape, which will be described later. The inventors determined that one of the reasons for such a characteristic is that the boron carbide sintering body has a characteristic of uneven residual stress overall.

The shaping die may be one having a length or a dimeter of 450 mm or more. Conventionally, a ceramic component like a focus ring is ordinarily applied in a ring shape having a diameter of 320 mm or more. Accordingly, in order to manufacture the ceramic component of the present disclosure, a bulk boron carbide sintering body having a considerably large diameter or length is required. Considering that the size of the sintering body is reduced in a sintering process and that some parts of the sintering body may be lost in a subsequent process of performing shaping machining, it is preferred that the shaping die has a diameter of 450 mm or more. The shaping die may have a diameter of 450 to 600 mm.

The sintering may proceed under the condition of the specific sintering temperature and the specific sintering pressure.

The sintering temperature may be about 1800 to about 2500° C. The sintering temperature may be about 1800 to about 2200° C. The sintering pressure may be about 10 to about 110 MPa. The sintering pressure may be about 15 to about 60 MPa. The sintering pressure may be about 17 to about 30 MPa. When the shaping operation proceeds under the condition of such a sintering temperature and such a sintering pressure, it is possible to manufacture a boron carbide with high etching resistance and a high density more efficiently.

The sintering time may be 0.5 to 10 hours. The sintering time may be 0.5 to 7 hours. The sintering time may be 0.5 to 4 hours.

The sintering time of the pressurizing and sintering method of the present disclosure is a considerably short time compared to a sintering process proceeding at atmospheric pressure. However, even though such a short time is applied, it is possible to manufacture a boron carbide sintering body having an equal or more excellent strength.

The sintering may proceed in a reducing atmosphere. In the reducing atmosphere, it is possible to manufacture a boron carbide sintering body with high etch resistance, in which the amount of boron carbide is increased and the area, where carbons are aggregated together, is decreased. This is because, the reducing atmosphere reduces materials such as boron oxide, which may be formed from reaction with oxygen in air.

In the sintering process, the boron carbide powder is grown and necked from one another to form a sintering body with a high strength. Additionally, an additive applied together is thought to inhibit or accelerate the growth of the boron carbide powder by changing the state and the ingredients of the additive depending on a temperature and a pressure. Besides, a boron carbide sintering body obtained through sintering, which proceeds with pressurizing, can have a more refined minute structure compared to a boron carbide sintering body obtained through the conventional sintering process.

Additional thermal treatment may be performed to a sintering body including a bulk boron carbide to improve the processability of shaping machining thereof.

The thermal treatment may include a primary treatment proceeding for 1 hour or more at a first temperature and a secondary treatment proceeding for 1 hour or more at a second temperature, and the first temperature may be higher than the second temperature.

The first temperature may be 1650° C. or more, and the second temperature may be 1400° C. or more. When the primary treatment and the secondary treatment proceed in such a temperature range, it is possible to perform thermal treatment more effectively.

The first temperature may be a temperature of 1650 to 1950° C. The primary treatment may proceed for 2 to 8 hours.

The second temperature may be a temperature of 1400 to 1600° C. The secondary treatment may proceed for 2 to 8 hours.

When the thermal treatment is applied at the first temperature and the second temperature, the shaping processability of the sintering body is considerably increased. This is thought to be a change in the distribution of residual stress induced from thermal treatment.

The shaping machining is a process of processing the sintering body to have a desired shape by separating or removing some parts of the sintering body. The shaping machining includes a ring process of processing the sintering body to be an appearance of a ceramic component like a ring shape. The shaping machining also includes a process of processing the boron carbide after ring process to be a shape of a ring type component such as a focus ring.

The shaping machining may be applied by electric-discharge machining, a waterjet method, a laser method or the like, but is not limited thereto.

After the boron carbide sintering body has a shape of a ceramic component through the shaping machining, the boron carbide sintering body may further be processed by a polishing, and the polishing is a process of lowering the surface roughness of the ceramic component. The polishing may proceed as a polishing process applied with slurry containing diamonds for industrial use, and it is preferred to process the ceramic component to have a maximum height roughness Rt of 15 μm or less, in order to obtain a ceramic component with an excellent particle characteristic. In detail, the maximum height roughness Rt of the surface of the ceramic component may be 0 to 25 μm. The maximum height roughness Rt may be 0 to 12 μm. The maximum height roughness Rt may be 0.1 to 10 μm. The maximum height roughness Rt may be 0.1 to 10 μm. The maximum height roughness Rt may be 0 to 2 μm. When having such surface roughness characteristic, the ceramic component may suppress formation of particles by a physical method in a plasm chamber.

When the boron carbide sintering body in the second operation is processed directly into shaping machining without thermal treatment in the third operation, the success rate of shaping machining is outstandingly low having a value of less than 10%, nearly close to 0%. The unbalances generated in the boron carbide such as unbalance in residual stress is thought to be one of important factors affecting low shaping processability.

The ceramic component of the present disclosure is obtained by shaping machining of a sintering body including a bulk boron carbide with a relatively large area, and it is thought to be one factor influencing the success rate of shaping machining considering that the boron carbide is one of typical difficult-to-cut material.

The focus ring may have a difference between an outer diameter and an inner diameter of 10 to 80 mm. The difference between an outer diameter and an inner diameter may be 15 to 60 mm. The difference between an outer diameter and an inner diameter may be 20 to 50 mm.

The ceramic component may be a ring type component having such a shape.

The ceramic component may have a thickness of 1 to 45 mm. The thickness of the ceramic component may be 1.5 to 40 mm. The thickness of the ceramic component may be 2 to 38 mm.

The focus ring as a ring-shaped component may have an inner diameter of 160 mm or more. The focus ring may have an inner diameter of 200 mm or more. Also, the focus ring may have the inner diameter of 300 mm or more. The focus ring may have the inner diameter of 450 mm or less.

For making a sintering body including boron carbide having such large diameter, shaping machining of a sintering body with a relatively large area is required. Also, boron carbide itself is a difficult-to-cut material with a high strength, and therefore the difficulties that can occur during shaping machining of boron carbide are further increased.

The inventors confirmed that, when the boron carbide sintering body itself is damaged during shaping machining, for example, when the phenomena such as break, cracks, and the like occur, the unbalance of residual stress measured in the boron carbide sintering body is shown to be comparatively serious. The boron carbide sintering body, in which break, or a crack occurs, may generate partial nonuniformity of etching resistance or the like, and cannot be substantially processed to be a ring type component, even though the processing succeeds, eventually leads to disposal. Accordingly, in one embodiment of the present disclosure, the inventors disclose that the boron carbide sintering body having the unbalance of residual stress of a certain level or less can be processed to be a ring type component.

The sintering body after passing through thermal treatment may have a standard deviation of residual stress measured at Position 1, Position 2 and Position 3 having a distance of 100 mm or more from one another, which is 10% or less of the average of residual stress values measured at Positions 1 to 3. Specifically, the standard deviation of residual stress may be 7% or less of the average, or 5% or less of the average. Also, the standard deviation of residual stress may be 0% or more of the average, or 1% or more of the average.

When such a standard deviation value of residual stress is a characteristic of the boron carbide sintering body, the residual stress is distributed to be comparatively uniform in the boron carbide sintering body overall, and the phenomena such as damage, break, defects, and the like caused from the unbalance of residual stress can be significantly reduced.

In contrast, the boron carbide in the second operation (the boron carbide before thermal treatment, particularly in the case of a sintering body) may have a standard deviation of residual stress values measured at Position 1, Position 2 and Position 3 having a distance of 100 mm or more from one another, which is more than 10% of the average of residual stress values measured at the Position 1, Position 2 and Position 3.

The standard deviation of residual stress of the boron carbide sintering body in the second step and the standard deviation of residual stress of the boron carbide sintering body in the third step are expressed as relative values with respect to the average value. Typically, the average value of residual stress of the boron carbide sintering body in the second operation is larger than the average value of residual stress of the boron carbide sintered body in the third operation. Therefore, the standard deviation value of residual stress of the boron carbide sintering body after thermal treatment of the third operation may be smaller than that of the boron carbide sintering body before thermal treatment in the second operation.

The Position 1, Position 2 and Position 3 may be for example, measured at an edge spot, a center spot, and a spot between the edge spot and the center spot, where each spots have a distance of 100 mm or more from the other spots, of the boron carbide sintering body in a disk shape. However, the Position 1, Position 2 and Position 3 are not placed at the same distance from the center of the sintering body in the disk shape.

The boron carbide sintering body before shaping machining after thermal treatment in the third operation may have a standard deviation of residual stress values measured at Position 1, Position 2 and Position 3, respectively, where each Positions have a distance of 100 mm or more from the other Positions, which is 100 MPa or less. The standard deviation of residual stress may be 80 MPa or less. The standard deviation of residual stress may be 50 MPa or less. The standard deviation of residual stress may be 0 MPa or more. The standard deviation of residual stress may be 10 MPa or more. In such a case, shaping machining can be performed more stably.

The boron carbide sintering body before shaping machining after thermal treatment in the third operation may have a difference of residual stress values, which is 300 MPa or less, measured at Position 1 and Position 2, distanced each other for 100 mm or more. The difference of residual stress measured at the Position 1 and Position 2 may be 250 MPa or less. The difference of residual stress measured at the Position 1 and Position 2 may be 200 MPa or less. The difference of residual stress measured at the Position 1 and Position 2 may be 150 MPa or less. The difference of residual stress measured at the Position 1 and Position 2 may be 120 MPa or less. When the difference of residual stress values is relatively small in this manner, shaping machining can be performed more stably.

The boron carbide sintering body before shaping machining after thermal treatment in the third operation may have a difference between the maximum value and the minimum value of residual stress values, which is 300 MPa or less, measured at Position 1 and Position 2, distanced each other for 100 mm or more. The difference of the maximum value and the minimum value may be 250 MPa or less. The difference of the maximum value and the minimum value may be 200 MPa or less. The difference of the maximum value and the minimum value may be 150 MPa or less. The difference of the maximum value and the minimum value may be 120 MPa or less. When the difference between the maximum value and the minimum value of residual stress values is relatively small in this manner, shaping machining can be performed more stably.

The boron carbide sintering body after thermal treatment in the third operation and before shaping machining may have a standard deviation of residual stress values measured at Position 1, Position 2 and Position 3, respectively, where each Positions have a distance of 100 mm or more from the other Positions, which is within 7% of the average value of residual stress values measured at the Position 1, Position 2 and Position 3. The standard deviation of residual stress values measured at the Position 1, Position 2 and Position 3 may be within 5% of the average value of residual stress values measured at the Position 1, Position 2 and Position 3. The standard deviation of residual stress values measured at the Position 1, Position 2 and Position 3 may be within 3% of the average value of residual stress values measured at the Position 1, Position 2 and Position 3. The standard deviation of residual stress values measured at the Position 1, Position 2 and Position 3 may be more than 0% of the average value of residual stress values measured at the Position 1, Position 2 and Position 3. When the standard deviation of residual stress values has a smaller value compared to the average value of residual stress values, it is possible to operate further stable shaping machining.

The above description of residual stress is for the boron carbide sintering body before shaping machining, but it can also be partially applied to a boron carbide sintering body after passing through shaping machining. Particularly, the sintering body after passing through shaping machining has a great difference between the residual stress measured on a surface corresponding to the outer diameter or an upper surface of the main body close thereto and the residual stress measured at a surface corresponding to the inner diameter or an upper surface of the mounting body close thereto.

When the residual stress is measured in a boron carbide sintering body, which is a ring-type component, at least one spot (PS3) may be measured at an upper surface of the mounting body, and other at least one spot (PS1) may be measured at an upper surface of the main body, from the ring-type component including the main body and the mounting body having different thicknesses with a step difference. When measured in this manner, the residual stress can be more clearly monitored whether the unbalance is present or not. The detailed description will be made below.

The above residual stress is described based on the result measured by X-ray diffraction, but the measuring method of residual stress is not limited thereto.

The ceramic component may include a main body including an upper surface and having a first height from a reference plane and a mounting body including an upper surface having a second height from the reference plane.

The upper surfaces of the main body and the mounting body may have been polished.

The further detailed description of the ceramic component is overlapped with the description below and omitted.

Ceramic Component 10

Figure 2:
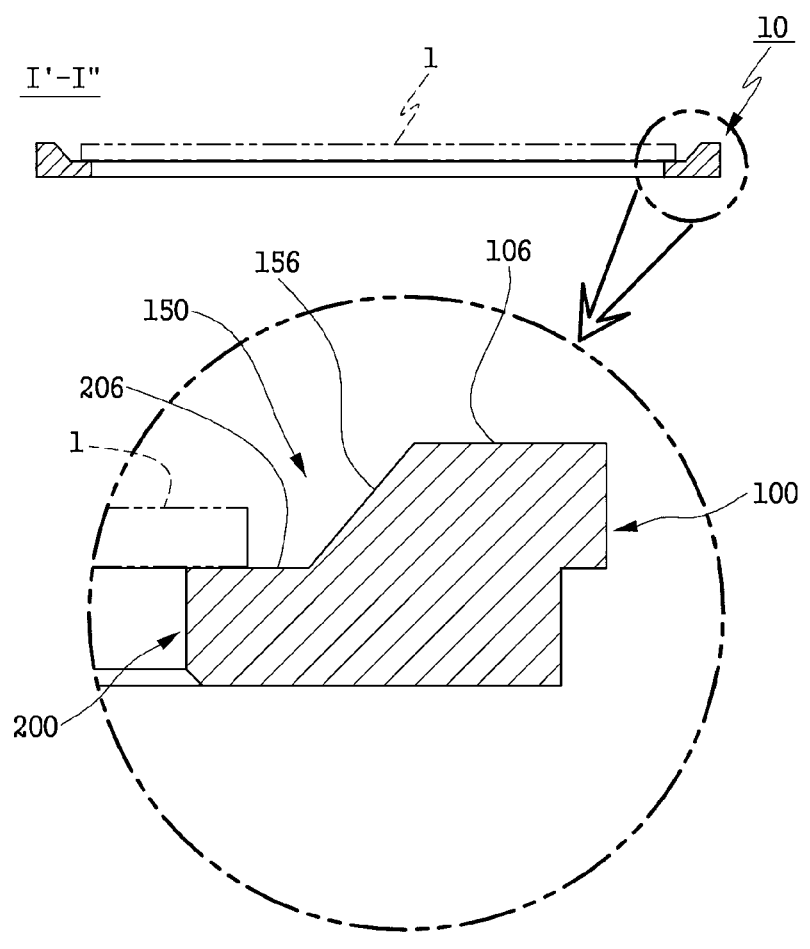
FIG. 2 is a schematic drawing for illustrating the section of the focus ring, which is an example of the ceramic component according to embodiments.

FIG. 1 is a schematic drawing for illustrating the view from an upper position of a ceramic component according to embodiments, and FIG. 2 is a schematic drawing for illustrating the section of a ceramic component according to embodiments. The ceramic component according to embodiments is described in further detail with reference to FIG. 1 and FIG. 2.

A ceramic component 10 according to embodiments includes boron carbide, wherein the residual stress values measured at surface of two spots with different distances from the center thereof are S1 and S2, respectively, and the difference between the S1 and S2 may be −600 to +600 MPa.

The ceramic component 10 includes a mounting body 200 having a first height and a main body 100 having a second height.

The main body 100 and the mounting body 200 are described to be distinguished from each other, but they can be prepared to be one body without the boundary for distinction as well as they can be prepared to be distinct from each other.

The mounting body 200 has a first height.

The main body 100 has a second height.

The first height and the second height respectively refer to the height to an upper surface of a main body and the height to an upper surface of a mounting body, based on a reference plane (for example, the reference plane may be the bottom plane of the main body or the bottom plane of the mounting body).

The first height and the second height may be different from each other, and specifically, the second height may be higher than the first height.

The mounting body 200 includes an upper surface 206 of the mounting body 200. The mounting body 200 and the upper surface 206 of the mounting body 200 may be one body type without separate layer distinction, or the mounting body 200 and the upper surface 206 of the mounting body 200 may be separate type, in which layers are distinguished from each other when observed in the section. In the case of a separate type, the upper surface 206 of the mounting body 200 may have a form of a deposition layer or a coating layer. The deposition layer or coating layer may be for example, a boron carbide layer. When the upper surface 206 of the mounting body 200 is a separate type, the upper surface 206 of the mounting body 200 in the shape of a deposition layer or a coating layer may have a thickness of 1 to 40% of the thickness of the mounting body 200, based on the thickness before being etched. The upper surface 206 of the mounting body 200 may have a thickness of 5 to 25% of the thickness of the mounting body 200, based on the thickness before being etched.

The main body 100 includes an upper surface 106 of the main body 100. The main body 100 and the upper surface 106 of the main body 100 may be one body type without separate layer distinction, or the main body 100 and the upper surface 106 of the main body 100 may be a separate type, in which layers are distinguished from each other when observed in the section. In the case of a separate type, the upper surface 106 of the main body 100 may have a form of a deposition layer or a coating layer. The deposition layer or a coating layer may be for example, a boron carbide layer. When the upper surface 106 of the main body 100 is a separate type, the upper surface 106 of the main body 100 in the form of a deposition layer or a coating layer may have a thickness of 1 to 40% of the thickness of the main body 100, based on the thickness before being etched. The upper surface of the main body may have a thickness of 5 to 25% of the thickness of the main body, based on the thickness before being etched.

The ceramic component 10 may further include a connecting body 150 connecting the mounting body 200 and the main body 100.

The mounting body 200 and the main body 100 are different in the height from each other, and the connecting body may connect the different heights thereof.

The main body 100, the mounting body 200, and the connecting body 150 are described to be distinguished, but they can be prepared to be one body without the boundary for distinction as well as they can be prepared to be distinguished from each other.

The connecting body 150 includes an upper surface 156 of the connecting body 150 connecting the upper surface 206 of the mounting body 200 and the upper surface 106 of the main body 100.

The connecting body 150 and the upper surface 156 of the connecting body 150 may be one body type without separate layer distinction, or a separate type, in which the connecting body 150 and the upper surface 156 of the connecting body 150 are layers distinguished from each other. In the case of a separate type, the upper surface 156 of the connecting body 150 may have a form of a deposition layer or a coating layer. The deposition layer or coating layer may be for example, a boron carbide layer. When the upper surface 156 of the connecting body 150 is a separate type, the upper surface 156 of the connecting body 150 in the form of a deposition layer or a coating layer may have a thickness of 1 to 40% of the thickness of the connecting body 150, based on the thickness before being etched. The upper surface 156 of the connecting part 150 may have a thickness of 5 to 25% of the thickness of the connecting body 150, based on the thickness before being etched.

For example, the connecting body angle (As) may be about 30 degrees to about 70 degrees, based on the non-exposed surface of the mounting body 200. The connecting body angle may be about 40 degrees to about 60 degrees. When having such the connecting body angle, the flow of plasma ions can be further stably controlled.

The connecting body angle may be a linear type or a non-linear type when observed at the section of the upper surface 156 of the connecting body 150, and the connecting body angle is measured at the section based on a virtual line straightly linking two spots of b (not shown), where the upper surface 206 of the mounting body 200 and the upper surface 156 of the connecting body meet, and P2 (now shown), where the upper surface 156 of the connecting body 150 and the upper surface 106 of the main body 100 meet.

The mounting body 200, the connecting body 150, and the main body 100 may be respectively ring shapes, but they are not limited thereto, and the shape thereof may be changed depending on an applied target.

The ceramic component 10 is one made from a sintering body including boron carbide by shaping machining thereof and overall, 90 wt % or more thereof may be formed of boron carbide. The ceramic component may be one formed of boron carbide for 93 wt % thereof. The ceramic component 10 may further include a coating layer additionally as needed.

The ceramic component 10 may have a bending strength of 300 MPa or more. The bending strength may be 450 MPa or less.

The ceramic component 10 may have a difference of the outer diameter and the inner diameter, which is 10 to 80 mm, and a thickness of 1 to 45 mm. The detailed description of the difference between the outer diameter and the inner diameter, and the thickness thereof is overlapped with the above description and further description thereof is omitted.

The ceramic component 10 may have an inner diameter of 160 mm or more. The detailed description of the inner diameter is overlapped with the above description and further description thereof is omitted.

The ceramic component 10 may have residual stress values measured at two spots with different distances from the center, that are S1 and S2, and the difference between S1 and S2 may be −600 to +600 MPa. The difference between the S1 and S2 may be −300 to +300 MPa. The difference between the S1 and S2 may be −200 to +200 MPa. The difference between S1 and S2 may be −150 to +150 MPa. The ceramic component having such a characteristic can have further stable processability and stability.

The ceramic component 10 may have residual stress values measured at spots with different distances from the center, that are S1, S2 and S3 and the difference between the maximum value and the minimum value among S1, S2 and S3 may be −600 to +600 MPa. The difference between the maximum value and the minimum value may be −300 to +300 MPa. The difference between the maximum value and the minimum value may be −200 to +200 MPa. The difference between the maximum value and the minimum value may be −150 to +150 MPa. The ceramic component having such a characteristic can have further stable processability and stability.

The difference between the maximum value and the minimum value of residual stress values measured at PS1, which is a spot on the upper surface of the main body, and PS3, which is a spot on the upper surface of the mounting body, may be within 40% of the average value of the residual stress values measured at PS1 and the PS3. The difference between the maximum value and the minimum value of residual stress values measured at PS1 and PS3 may be within 15% of the average value of the residual stress values measured at PS1 and the PS3. The difference of the maximum value and the minimum value of residual stress values measured at PS1 and PS3 may be within 10% of the average value of the residual stress values measured at PS1 and the PS3. The difference between the maximum value and the minimum value of residual stress values measured at PS1 and PS3 may be 1 to 10% of the average value of the residual stress values measured at PS1 and the PS3. The ceramic component having such a characteristic can have further stable processability and stability.

The ceramic component 10 may have a difference of −600 to +600 MPa between the residual stress values measured at PS1 and the residual stress value measured at PS3. The difference between the residual stresses measured at PS1 and PS3 may be −300 to +300 MPa. The difference may be −200 to +200 MPa. The difference may be −150 to +150 MPa. Also, the difference may be −130 to +130 MPa. In such a case, it is possible to obtain a ceramic component with a higher density and excellent processability.

The ceramic component 10 may have a standard deviation of 300 MPa or less of residual stresses measured at PS1, which is one spot of the upper surface of the main body, PS3, which is one spot of the upper surface of the mounting body, and PS2, which is one spot of the upper surface of the connecting body, respectively. The standard deviation of residual stress may be 250 MPa or less. Also, the ceramic component may have a standard deviation of residual stress of 150 MPa or less. The standard deviation of the residual stress values may be 75 MPa or less. The standard deviation of the residual stress may be more than 0 MPa. The standard deviation of the residual stress may be 0.1 MPa or more. When having such the standard deviation, the ceramic component with a higher density and excellent processability can be obtained.

The ceramic component 10 may have a standard deviation of residual stress respectively measured at PS1, PS3, and PS2, which is 20% or less of the average of the residual stress values measured at PS1, PS2, and PS3. The standard deviation may be 15% or less of the average of residual stress values. The standard deviation may be 10% or less of the average of residual stress values. The standard deviation may be 8% or less of the average of residual stress values. When having such the characteristic, the ceramic component with a higher density and excellent processability can be obtained.

The difference of the ceramic component 10 between the residual stress values respectively measured at PS1, PS3, and PS2 and the average of residual stress values measured at PS1, PS2, and PS3, may be −350 to +350 MPa. The difference may be −300 to +300 MPa. The difference may be −250 to +250 MPa. The residual difference may be −200 to +200 MPa. When having such the characteristic, the ceramic component with a higher density and excellent processability can be obtained.

The ceramic component may have a difference between the maximum value and the minimum value of residual stress values respectively measured at PS1, PS3, and PS2 within 25% of the average thereof. The difference may be within 20% of the average. The difference may be within 15% of the average. The difference may be within 10% of the average. The difference may be within 5% of the average. The difference may be 1% or more of the average. When having the distribution of residual stress, etch resistant material with further stability can be obtained, while allowing the shaping machining to be further stable.

The ceramic component 10 may have a standard deviation of 350 MPa or less of residual stress values measured at surface of spots with different distances from the center. The c standard deviation may be 300 MPa or less. The a standard deviation may be 250 MPa or less. The standard deviation may be 200 MPa or less. The standard deviation may be 120 MPa or less. The standard deviation may be 100 MPa or less. The standard deviation may be more than 0 MPa. The standard deviation may be 0.1 MPa or more. According to the results confirmed by the inventors, the sintering body in a ring shape does not have a great difference in the residual stress values measured at surface of various spots with the same distance from the center. Accordingly, when having the same characteristic as the above, a focus ring, whose processability, stability, and the like are excellent by relatively even distribution in residual stress, can be provided.

The ceramic component 10 is one, which has been treated with polishing, and the maximum height roughness Rt of the upper surface of the main body may be 10 μm or less, and the maximum height roughness Rt of the upper surface of the mounting body may be 15 μm, as descried in the above.

The ceramic component 10 is one, which has been treated with polishing, and the maximum height roughness Rt of the upper surface of the connecting body may be 30 μm or less. The maximum height roughness Rt of the upper surface of the connecting body may be 15 μm or less. The maximum height roughness Rt of the upper surface of the connecting body may be 10 μm. The maximum height roughness Rt of the upper surface of the connecting body may be 0.1 μm or more.

In such a case, the problem of particle formation, which may occur by physical factors when plasma is etched, can be substantially suppressed.

Manufacturing Method of Focus Ring and Focus Ring

A manufacturing method of a focus ring according to one embodiment includes an operation of preparing a material including boron carbide before processing; and an operation of shaping machining after thermal treatment of the material to manufacture a focus ring.

The operation of manufacturing a focus ring may include a thermal treatment process, and a shaping process.

The operation of manufacturing a focus ring may include a thermal treatment process, a shaping process, and a polishing process.

The thermal treatment includes a primary treatment proceeding for 1 hour or more at a first temperature and a secondary treatment proceeding for 1 hour or more at a second temperature, and the first temperature may be higher than the second temperature.

The boron carbide before processing may be one, which has been manufactured by a manufacturing method of a sintering body. The boron carbide before processing may be one, which has been manufactured by a manufacturing method at pressurized atmosphere of a sintering body. The boron carbide before processing may be one, which has been manufactured by a manufacturing method at normal pressure of a sintering body.

The boron carbide may be one, which has been manufactured by a deposition method.

The manufacturing method of the sintering body includes a first operation of preparing a granulated raw material by making a slurry of a raw material composition including boron carbide powder and granulating the slurry; and a second operation of filling the granulated raw material into the shaping die for sintering thereof and manufacturing the sintering body, in which the boron carbide powder is necked.

In the manufacturing method of a focus ring, the process of thermal treatment, raw material, boron carbide powder, the first operation and second operation, sintering, and the like are overlapped with the above description and thus further description is omitted.

The focus ring includes a mounting body having a first height from a reference plane and a main body having a second height from the reference plane, wherein the mounting body includes an upper surface of the mounting body, where an etching target is placed, and the main body includes an upper surface of the main body, which is directly etched by plasma.

The residual stresses measured at PS1, which is one spot on the upper surface of the mounting body, and PS3, which is one spot of the upper surface of the main body, have a difference, which is within 40% of the average value of the residual stress values measured at PS1 and PS3.

The operation of manufacturing the focus ring includes a shaping process including a process of etching or cutting the material to be a shape of a focus ring including the mounting body and the main body.

The operation of manufacturing a focus ring further includes a polishing process after the shaping process.

The polishing process is a process of polishing the upper surfaces including the upper surface of the mounting body and the upper surface of the main body and adjusting the surface roughness thereof.

The shaping process and the polishing process are overlapped with the above description and further description is omitted.

A focus ring according to example embodiments includes a boron carbide, and includes a mounting body having a first height from a reference plane and a main body having a second height from the reference plane, wherein the mounting body includes an upper surface of the mounting body, in which an etching target is placed, and the main body includes an upper surface of the main body, which is directly etched by plasma, wherein PS1, which is one spot on the upper surface of the mounting body, and PS3, which is one spot on the upper surface of the main body, have a difference in the residual stress, which is within 40% of the average value of the residual stress values measured at PS1 and PS3.

The residual stress values measured at two spots on the surface of the focus ring having different distances from the center of the surface may be S1 and S2, respectively, and the difference of between S1 and S2 may be −600 to +600 MPa.

The residual stress measured at the PS1 may be larger than the residual stress value measured at PS3.

The focus ring may have a standard deviation of the residual stresses, which is 350 MPa or less, measured at three spots on the surface of the focus ring with different distances from the center of the surface.

The focus ring may further include a connecting body between the mounting body and the main body.

The focus ring may include an upper surface of the connecting body in the connecting body for connecting the upper surface of the mounting body and the upper surface of the main body.

The focus ring has PS2, which is one spot on the upper surface of the connecting body.

The focus ring may have a difference between the maximum value and the minimum value among residual stress values measured at PS1, PS2 and PS3, respectively, which is within 25% of the average of residual stress values measured at PS1, PS2 and PS3, respectively. The standard deviation may be within 20% of the average of residual stress values.

The standard deviation of residual stress values measured at PS1, PS2, and PS3, respectively, may be 300 MPa or less.

The residual stress values measured at PS1, PS2, and PS3, respectively, may have a difference of −350 to +350 MPa with the average thereof.

The focus ring may have a bending strength of 300 MPa or more.

The focus ring may have a thickness of 1 to 45 mm.

The focus ring may include boron carbide with a thickness of 1 to 45 mm.

The focus ring may have an inner diameter of the mounting body of 160 mm or more.

The focus ring may have a difference between the outer diameter of the main body and the inner diameter of the mounting body of 10 to 80 mm.

Other characteristics such as residual stress of the focus ring, residual stress at two spots or three spots with different distances from the center, and surface roughness are overlapped with the above description and thus further description is omitted.

The center of the focus ring corresponds the center of a circle in the case of a focus ring in the ring shape, or takes the crossing point of a long axis and a short axis in the case of a focus ring not having a ring shape.

Manufacturing Method of Semiconductor Element

A manufacturing method of a semiconductor element according to one embodiment includes a process of etching a substrate by applying a focus ring described above and thereby manufactures the semiconductor element.

The substrate may be a Si substrate, SiC substrate, or GaN substrate.

Hereinafter, the present disclosure will be described in further detail through detailed example embodiments. The example embodiments below are no more than examples for helping to understand the present disclosure, and the scope of the present application is not limited thereto.

Example 1. Manufacture of Ceramic Component

1) Manufacture of Disk-Shaped Sintering Body to which Pressurizing Sintering Method is Applied Raw materials such as a boron carbide powder (particle size D50=0.7 μm) and a phenol resin (residual carbon rate of about 42 wt %), and a solvent were placed in a slurry blending machine in the amount ratio disclosed in Table 1

The granulated raw material was filled into a rubber mold having a hollow hole in a disk shape and loaded into CIP (Cold Isostatic Press) apparatus, and after that, pressurizing was performed to manufacture a green body with an outer diameter of about 488 mm or more. This green body was treated by green processing to have the shape of a focus ring, and subsequently a carbonation process was performed. The green body, to which a carbonation process had been operated, sintered at normal pressure in the temperature and time disclosed in Table 1 below in a sintering furnace. A disk-shaped sintering body sintered at normal pressure with a diameter of 488 mm and a hollow hole was manufactured. Each disk-shaped sintering body is abbreviated as a sample in Table 1 below.

TABLE 1

| Example # | Additive 1 (wt %)* | Additive 2 (wt %)** | Boron Carbide Powder (wt %) | Sintering Temperature (° C.) | Sintering Time (Hours) | Sintering Pressure (Mpa) | Diameter Before Sintering (mm) |
|---|---|---|---|---|---|---|---|
| Pressurized Sample 1 | 4 | — | Residual Amount | 1950 | 5 | 25 | 488 |
| Pressurized Sample 2 | 4 | — | Residual Amount | 1950 | 5 | 25 | 488 |
| Pressurized Sample 3 | 4 | — | Residual Amount | 1950 | 5 | 25 | 488 |
| Sample at Normal Pressure | 10 | 2 | Residual Amount | 2380 | 15 | Atmospheric Pressure | 488 |

*Additive 1 is phenol resin.
**Additive 2 is boron oxide.

below and mixed by a ball-mill method to manufacture a raw material in the state of slurry. The raw material made into slurry was sprayed and dried to manufacture a granulated raw material.

The granulated raw material is filled into a shaping die in a disk shape, and the temperature, pressure and time disclosed in Table 1 below were applied to manufacture a disk-shaped sintering body sintered while being pressurized with a diameter of about 488 mm (before thermal treatment).

Thermal treatment 1 was performed on the disk-shaped sintering body for 2 to 5 hours at a temperature of 1400 to 1600° C.

Thermal treatment 2 was performed on the disk-shaped sintering body by primary treatment for 2 to 3.5 hours at a temperature of 1650 to 1950° C. and secondary treatment for 3 to 6 hours at a temperature of 1400 to 1600° C.

Thermal treatment 3 was performed on the disk-shaped sintering body by primary treatment for 4 to 6 hours at a temperature of 1650 to 1950° C. and secondary treatment for 3 to 6 hours at a temperature of 1400 to 1600° C.

2) Manufacture of Disk-Shaped Sintering Body to which Sintering at Normal Pressure is Applied Raw materials such as boron carbide powder (particle size D50=0.7 μm) and a phenol resin (residual carbon rate of about 42 wt %), and a solvent were placed in a slurry blending machine and mixed by ball-mill method to manufacture a raw material made into slurry. This raw material made into slurry was sprayed and dried to manufacture a granulated raw material.

3) Measurement of Residual Stress of Disk-Shaped Sintering Body

Residual stress of a disk-shaped sintering body was measured by using X-ray diffraction.

The residual stress values of total three spots of Position 1, which is the center, Position 3, which is within 10% of the diameter from the edge, and Position 2, which is between the Position 1 and Position 3, of a disk-shaped sintering body of about 488 mm were measured. The Position 1, Position 2, and Position 3 are spots having a distance from each other of 100 mm or more, respectively. The degree of residual stress depending on whether thermal treatment is performed was ascertained by utilizing Pressurized Sample 3 manufactured under the same pressurizing condition and with the same composition, and shown in Table 2 below.

The disk-shaped sintering bodies applied to the measurement were manufactured to have a various thicknesses of 8 to 40 mm. In Table 2 below, the disk-shaped sintering body sintered at normal pressure was abbreviated as Sample at Normal Pressure, and a disk-shaped sintering body sintered with being pressurized was abbreviated as Pressurized Sample. In Table 2 below, thermal treatment was applied by Thermal Treatment 3 described in the above. In the Table 2, standard deviation was calculated by applying STDEV.P function in Excel available from MICROSOFT (hereinafter, the same methods are used for the measurement of standard deviation).

TABLE 2

| | Thermal Treatment | Position 1 (MPa) | Position 2 (MPa) | Position 3 (MPa) | Average (MPa) | Standard Deviation (MPa) | Maximum-Minimum (MPa) |
|---|---|---|---|---|---|---|---|
| Pressurized Sample 2 (Before Thermal Treatment) | not applied | 1905.3 | 2174.7 | 2304.9 | 2128.3 | 166.4026 | 399.6 |
| Pressurized Sample 2 (After Thermal Treatment) | applied | 2030.9 | 2108.3 | 2138.4 | 2092.5 | 45.28063 | 107.5 |

Referring to Table 2 above, it may be confirmed that a pressurized sample, to which a thermal treatment is performed, and a pressurized sample, to which a thermal treatment is not performed, have a remarkable difference in residual stress by positions. Particularly, the average value of residual stress values measured at three positions different from one another did not show a great difference, but the standard deviation had a difference of about 3.6 times or more, and the difference between the maximum and the minimum was also shown as a difference of about 3.7 times or more. Such a difference is thought to be one of reasons of break phenomenon occurring with a comparatively high probability in a shaping machining process described in below.

4) Shaping Machining to Manufacture Ceramic Component Having a Ring Shape

A disk-shaped sintering body sintered while being pressurized manufactured as above 1) was one, to which a thermal treatment was not performed, or one, to which a thermal treatment was performed. Both were treated by shaping machining, respectively. The disk-shaped sintering body sintered at normal pressure manufactured as above 2) was also treated by shaping machining. Focus rings with the shapes disclosed in FIG. 1 and FIG. 2 were manufactured as ceramic components.

The shape of a ceramic component was a ring shape having an outer diameter of about 388 mm, an inner diameter of about 300 mm, and a height of about 2.5 mm of a mounting body, where the edge of the ceramic component is placed, wherein the height of the upper surface is about 4.5 mm.

The above disk-shaped sintering body sintered at normal pressure was treated by shaping machining by applying electric discharge machining. The above disk-shaped sintering body sintered while being pressurized was treated by shaping machining by applying water jet. Each sample was evaluated to have processability of shaping machining only when the sintering body was not broken or a crack was not generated, and the quantity of tests and the success rate of shaping machining processability (the ratio of the quantity of focus rings, in which a crack or break does not occur, compared to the quantity of total disk-shaped sintering bodies) were evaluated depending on each manufacturing method/thermal treatment methods and shown in Table 3.

TABLE 3

| Sample | Thermal Treatment Condition | The Quantity of Tests | Shaping Machining Processability (%) |
|---|---|---|---|
| Disk-shaped Sintering Body | Thermal Treatment Was Not Applied | 30 | 100 |

TABLE 3-continued

| Sample | Thermal Treatment Condition | The Quantity of Tests | Shaping Machining Processability (%) |
|---|---|---|---|
| Sintered at Normal Pressure | | | |
| Disk-shaped Sintering Body Sintered with Being Pressurized | Thermal Treatment Was Not Applied | 20 | 0 |
| Disk-shaped Sintering Body Sintered with Being Pressurized | Thermal Treatment 1 | 4 | 0 |
| Disk-shaped Sintering Body Sintered with Being Pressurized | Thermal Treatment 2 | 67 | 89 |
| Disk-shaped Sintering Body Sintered with Being Pressurized | Thermal Treatment 3 | 51 | 100 |

Referring to Table 3 above, it may be confirmed that whether a thermal treatment was performed and which thermal treatment was performed had an important impact related to whether shaping machining, in the case of sintered while being pressurized, which is different from the case of sintered at normal pressure. This is thought to be a result related to the result of residual stress measurement of Table 2 above, and the unbalance of residual stress inside a sintering body formed while being pressurized and shaped is thought to be a reason of generating a crack of the sintering body itself or breaking the sintering body itself in a shaping machining process of the focus ring, to which comparatively minute shaping machining is required. The above cases of thermal treatment 2 and thermal treatment 3 are thought to be the case improved in the processability of shaping machining due to reasons such as removal of residual stress in this manner through a sufficient thermal treatment. The ceramic component manufactured in this manner passed through a polishing process and a property evaluation was performed.

Example 2. Property Evaluation of Ceramic Component

The properties of the manufactured ceramic component were evaluated below.

1) Evaluation of Relative Density

Relative Density (%) was measured by Archimedes principle, and the result was disclosed in Table 4 below.

2) Evaluation of Bending Strength

Bending Strength was measured by UTM apparatus (manufacturer H&P) in accordance with ASTM C 1161 Flexual Strength by preparing ten ceramic components, and subsequently the average of values except for the minimum value and the maximum value was disclosed in Table 4 below.

3) Measurement of Surface Roughness and Presence or Non-Presence of the Occurrence of Particles Whether particles were formed was evaluated by the atmosphere when the etching rate characteristic was evaluated or presence or non-presence of particles remaining inside the equipment chamber after the evaluation. The surface roughness was measured based on the maximum height roughness by measuring four spots or more on the upper surface of the main body and the upper surface of the mounting body, respectively, and the average was calculated. As the result, the upper surface of the main body was measured to be about 10.7 μm, and the upper surface of the mounting body was measured to be about 4.6 μm.

Each ceramic component was abbreviated as a sample in Table 1 below. All the ceramic components have a thickness of about 5 mm, an outer diameter of about 388 mm, and an inner diameter of about 290 mm.

TABLE 4

| Example # | Relative Density (%) | Bending Density (Mpa) | The Occurrence of Particles |
|---|---|---|---|
| Pressurized Sample 1 | 93 | 308 | none |
| Pressurized Sample 2 | 95 | 429 | none |
| Pressurized Sample 3 | 99.9 | 476 | none |
| Sample at Normal Sample | 95 | 240 | none |

Referring to the above results, it may be confirmed that the sample at normal pressure showed a considerable difference from the pressurized samples in terms of the bending strength. Such a difference is a result showing that, even though the samples have similar relative density values, may have a considerable difference in the bending strength depending on the difference of manufacturing methods, and the measurement of bending strength is thought to be one of characteristics for distinguishing a pressurized ceramic component and a ceramic component manufactured at normal pressure.

It was verified that particles were not generated inside a plasma apparatus in plasma atmosphere including fluorine or chlorine for both pressurized sample and a sample at normal pressure overall. In addition, it was verified that not only a sample at normal pressure but also a pressurized sample can be processed to be a shape of a ceramic component, in which the difference of the outer diameter and the inner diameter was comparatively small and the thickness was also considerably thin, after passing through a thermal treatment.

4) Measurement of Residual Stress of Ceramic Component

The residual stress values were measured at the surface of ring type components by using X-ray diffraction for Sample 1, to which thermal treatment 1 was applied, Sample 2, to which thermal treatment 2 was applied, and Sample 3, to which thermal treatment 3 was applied.

The ceramic components manufactured above were measured for residual stresses on the upper surface of the main body (figure number 206 and PS1 of FIG. 2), the upper surface of the connecting body (figure number 156 and PS1 of FIG. 2), and the upper surface of the mounting body (figure number 106 and PS3 of FIG. 2), respectively, and the result was shown in Table 5 below. The upper surface of the main body was indicated as Position 1, the upper surface of the connecting body was indicated as Position 2, and the upper surface of the mounting body was indicated as Position 3.

Additionally, even though not shown in a table below, no significant difference was observed between the upper surfaces of the main body of the same sample, between the upper surfaces of the connecting body of the same sample, and between the upper surfaces of the mounting body of the same sample.

TABLE 5

| Index Position | Sample 1 (Thermal Treatment 1) | | | Sample 2 (Thermal Treatment 2) | | | Sample 3 (Thermal Treatment 3) | | |
|---|---|---|---|---|---|---|---|---|---|
| | PS1 | PS2 | PS3 | PS1 | PS2 | PS3 | PS1 | PS2 | PS3 |
| Residual Stress (Mpa)# | 1813.9 | 1662.5 | 1249.4 | 1508.6 | 1311.8 | 1400.1 | 1700.6 | 1624.6 | 1556.5 |
| Standard Deviation# | 102.5 | 90.1 | 82.9 | 107.2 | 127.6 | 121.3 | 103.5 | 91.5 | 89.2 |
| The Ratio of Standard Deviation Compared to Residual Stress (%) | 5.65% | 5.42% | 6.64% | 7.11% | 9.73% | 8.66% | 6.09% | 5.63% | 5.73% |
| Standard Deviation (Mpa) | | 1575.3 | | | 1406.8 | | | 1627.2 | |
| The Value of Each Spot-The Average of Residual Stress Values of Three Spots*(Mpa) | 238.63 | 87.23 | 325.87 | 101.77 | 95.03 | 6.73 | 73.37 | 2.63 | 70.73 |
| The Value of Each Spot-The Average of Residual Stress | 15.1% | 5.5% | 20.7% | 7.2% | 6.8% | 0.5% | 4.5% | 0.2% | 4.3% |

TABLE 5-continued

| Index | Sample 1 (Thermal Treatment 1) | | | Sample 2 (Thermal Treatment 2) | | | Sample 3 (Thermal Treatment 3) | | |
|---|---|---|---|---|---|---|---|---|---|
| Position | PS1 | PS2 | PS3 | PS1 | PS2 | PS3 | PS1 | PS2 | PS3 |
| of Three Spots*(%) | | | | | | | | | |
| The Standard Deviation of Residual Stress of Three Spots (Mpa) | | 238.6 | | | 80.5 | | | 58.9 | |
| The Standard Deviation of Residual Stress of Three Spots (%) | | 15.14% | | | 5.72% | | | 3.62% | |
| The Difference between PS3 and PS1*(Mpa) | | 564.5 | | | 108.5 | | | 144.1 | |
| The Average of PS3 and PS1 | | 1531.7 | | | 1454.4 | | | 1628.6 | |
| The Difference between PS3 and PS1*(%**) | | 36.9% | | | 7.5% | | | 8.8% | |

*All the difference values are shown as the absolute values. The values are abbreviated as PS1, PS2 and PS3, and refer to residual stress values at respective spots.
**Difference (%) means % of the difference value compared to the average value.
Residual stress and standard deviation were obtained as follows. Residual stresses were obtained by averaging residual stress values measured several times while rotating Samples, and Standard deviation was obtained by a standard deviation of measured values used in calculation of the residual stress.

Referring to the result of Table 5, a ring type components were formed by performing thermal treatment and processing a sintering body of example embodiments. All of Samples 1 to 3 were the same in that shaping machining was possible, but had a difference in the degree of residual stress.

The difference of residual stress values between PS3 and PS1 was shown as the largest in the case of Sample 1, and was shown as larger in the case of Sample 3 than the case of Sample 2. The average of residual stress was larger in Sample 3 than Sample 2. It is possible that the residual stress value itself remaining in materials may have a slight difference depending on various factors such as a manufacturing process and a processing method. Such a difference among residual stress values may be considered as unbalance of residual stress in the same sample, and therefore, the result may show that, as the value or ratio is lower, the efficiency of processing is higher and various processing method can be applied.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A ceramic component comprising:

a boron carbide material; and a surface having a first spot and a second spot having a different distance from a center of the surface, wherein the ceramic component comprises a focus ring of a plasma etching equipment, wherein the ceramic component comprises boron and carbon in an amount of 90 mol % or more, and wherein a difference between a first residual stress measured at the first spot and a second residual stress measured at the second is −600 to +600 MPa, such that etching resistance and impact resistance of the focus ring are increased.

2. The ceramic component of claim 1, wherein a difference between a maximum value and a minimum value among the first residual stress, the second residual stress, and a third residual stress measured at a third spot on the surface having a different distance from the center of the surface than the first spot and the second spot, is −600 to +600 MPa.

3. The ceramic component of claim 1, wherein the ceramic component is a part of a device for manufacturing a semiconductor element.

4. The ceramic component of claim 1, wherein the ceramic component comprises a main body having a first height from a reference plane and a mounting body having a second height from the reference plane, and wherein the surface of the ceramic component comprises an upper surface of the main body and an upper surface of the mounting body, and wherein the first spot is disposed on the upper surface of the main body and the second spot is disposed on the upper surface of the mounting body.

5. A focus ring of a plasma etching equipment, the focus ring comprising:

a boron carbide material;

a main body having a first height from a reference plane and a main body residual stress measured on an upper surface of the main body; and a mounting body having a second height from the reference plane and a mounting body residual stress measured on an upper surface of the mounting body, wherein the upper surface of the main body is etched by plasma and an etching target is mounted on the upper surface of the mounting body, and wherein a difference between the main body residual stress and the mounting body residual stress is within 40% of an average of the main body residual stress and the mounting body residual stress, such that the etching resistance and impact resistance of the focus ring are increased.

6. The focus ring of claim 5, wherein the difference of the main body residual stress and the mounting body residual stress is −600 to +600 MPa.

7. The focus ring of claim 5, wherein a standard deviation of residual stresses measured at three spots on the upper surface of the main body and the upper surface of the mounting body having different distances from a center of the focus ring is 350 MPa or less.

8. The focus ring of claim 5, further comprising a connecting body between the main body and the mounting body, wherein the connecting body comprises an upper surface connecting the upper surface of the mounting body and the upper surface of the main body.

9. The focus ring of claim 8, wherein a difference between a maximum value and a minimum value among the main body residual stress, the mounting body residual stress, and a connecting body residual stress measured at a spot on the upper surface of the connecting body is within 25% of an average of the main body residual stress, the mounting body residual stress, and the connecting body residual stress.

10. The focus ring of claim 5, wherein the focus ring has a bending strength of 300 MPa or more.

11. The focus ring of claim 5, wherein the focus ring is a part of a device for manufacturing a semiconductor element.

* * * * *